United States Patent [19]

Ogawa

[11] Patent Number: 4,715,929
[45] Date of Patent: Dec. 29, 1987

[54] PATTERN FORMING METHOD

[75] Inventor: Kazufumi Ogawa, Hirakata, Japan

[73] Assignee: Matsushita Electric Industrial Co., Ltd., Osaka, Japan

[21] Appl. No.: 885,824

[22] Filed: Jul. 15, 1986

[30] Foreign Application Priority Data

Jul. 19, 1985 [JP] Japan .................................. 60-160507

[51] Int. Cl.⁴ ............................ B44C 1/22; B05D 3/06
[52] U.S. Cl. ..................................... 156/643; 156/657; 156/659.1; 427/43.1; 427/54.1
[58] Field of Search ....................... 427/43.1, 44, 54.1; 156/655, 657, 659.1, 643

[56] References Cited

U.S. PATENT DOCUMENTS

| | | | |
|---|---|---|---|
| 3,779,806 | 12/1973 | Gipstein et al. | 117/212 |
| 3,825,466 | 7/1974 | Martin | 156/643 X |
| 4,426,247 | 1/1984 | Tamamura et al. | 156/643 |
| 4,539,061 | 9/1985 | Sagiv | 156/278 |

Primary Examiner—Kenneth M. Schor
Attorney, Agent, or Firm—Wenderoth, Lind & Ponack

[57] ABSTRACT

Method of forming any film pattern on an arbitrary substrate, more particularly, a pattern forming method which comprises selectively forming a film on an arbitrary substrate, by use of chemical vapor reaction, and further, a method of forming the pattern of an organic film by selectively removing the organic film at a lower layer, using the pattern of the Langmuir-Blodgett's film or chemical adsorption film containing Si as a mask.

10 Claims, 10 Drawing Figures

PATTERN FORMING METHOD

BACKGROUND OF THE INVENTION

The present invention relates to a pattern forming method which can be used in manufacture of semiconductor elements, printing plates, etc., and particularly relates to a pattern forming method of selectively forming a film on an arbitrary substrate by use of chemical vapor reactions.

Heretofore, resist patterns in the manufacture of semiconductor elements or resin patterns which provide negative plates in the manufacture of printing plates have been manufactured in the following manner; A resin film which may be polymerized or decomposed by irradiation of light is formed on the substrate and, then, light beam are irradiated in any arbitrary pattern on the resin film, followed by development, thereby forming the pattern. More and more refining of these resist patterns has become demanded for attainment of higher density of semiconductor elements and higher quality of printed forms.

Particularly, in the manufacture of a very large scale integrated circuit (VLSI), there has arisen the need for forming at a high accuracy a resist pattern in fine lines of submicron order. While this process is largely affected by the physical properties of the resist itself, generally, the finer the desired pattern (thus, for increasing the resolution), the resist film applied needs to thinner. On the other hand, when it comes down to providing submicron patterns, wet etching can not be utilized, but such a dry etching as ion etching, plasma etching or sputter etching, etc., must be utilized. In order to improve the dry etching resistance of the resist pattern, generally, the resist coating needs to be thick.

Accordingly, in order to meet the above-stated two requirements, it is advisable to develop a photoresist whose coating is thick, but gives high resolution, or a photoresist whose coating is thin but gives high dry-etching resistance. However, presently, there is no such material available.

SUMMARY OF THE INVENTION

It is the object of this invention to provide a method for forming a pattern which has high resolution and excellent etching resistance.

This and other objects will be accomplished by a pattern forming method which comprises the steps of forming on a substrate a responsive film containing responsive groups which undergo chemical reactions under irradiation by an energy beam, deactivating the responsive groups in a pattern by irradiating energy beams in the pattern onto said responsive film to thereby form an irradiated film, and irradiating the entire surface of said irradiated film with energy beams, after placing the substrate having the irradiated film forms, in a polymerizing monomer atmosphere to additionally polymerize said polymerizing monomer onto the responsive film except for said irradiated film area, thereby forming a polymerized film in a pattern.

In a specific embodiment, in the step of forming a responsive film, a monomolecular responsive film is formed so that the responsive groups may be exposed in line on the substrate surface by the LangmuirBlodgett process, adsorption method or the like. As a polymerizing monomer, a substance containing Si is used. After forming a photosensitive film on an arbitrary substrate through an organic film, a polymerized film in a pattern is formed by a substance selectively containing Si, and is processed by oxygen plasma, thereby transferring the pattern containing Si onto said organic film. As the responsive group of the responsive film and as the polymerizing group of the polymerizing monomer, the vinyl group or ethynyl group is contained.

This invention has various advantages, among which is its capability of forming the pattern at a high resolution and with excellent etching resistance.

While the novel features of the invention are set forth with particularity in the appended claims, the invention, both as to its organization and content, will be better understood and appreciated, along with other objects and features thereof, from the following detailed description taken in conjunction with the drawings.

DETAILED DESCRIPTION OF THE INVENTION

In the following, embodiments of the pattern forming method of this invention are described with reference to FIGS. 1-3.

Embodiment 1

A first embodiment of this invention is described with reference to FIG. 1. On a Si substrate 10 formed with $SiO_2$, there is formed by chemical adsorption process, a monomolecular film 12 of

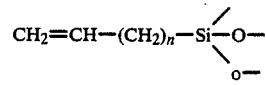

through the reaction of the surface substrate with a silane surface active agent, e.g., $CH_2=CH-(CH_2)_n-SiCl_3$ (n represents an integer, preferably being 10-20, $CH_2=CH-$ may be $CH\equiv CH-$). For example, the treated substrate is dipped in a silane surface active agent solution of this surfactant at a concentration of $2.0\times10^{-3}-5.0\times10^{-2}$ mol/l in 80% n-hexane, 12% carbon tetrachloride and 8% chloroform, to form a bonding 14 of

Figure 1A:
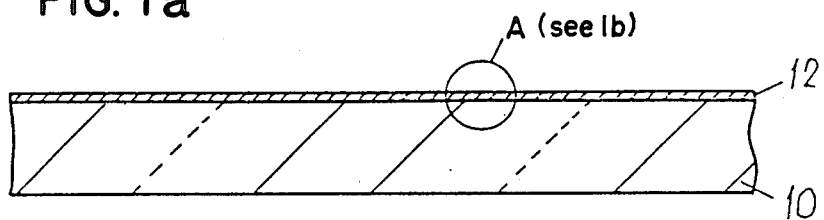
FIGS. 1(a)-(f) are sectional views showing the steps of a first embodiment for explanation of the method of this invention, (a), (c) and (e) of this figure representing conceptual views of a section of the substrate in the successive steps, and (b), (d) and (f) of this figure expanded views at the molecule level of the parts A-C indicated in (a), (c) and (e) respectively.

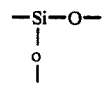

at the $SiO_2$ surface [FIG. 1(a)].

Figure 1B:
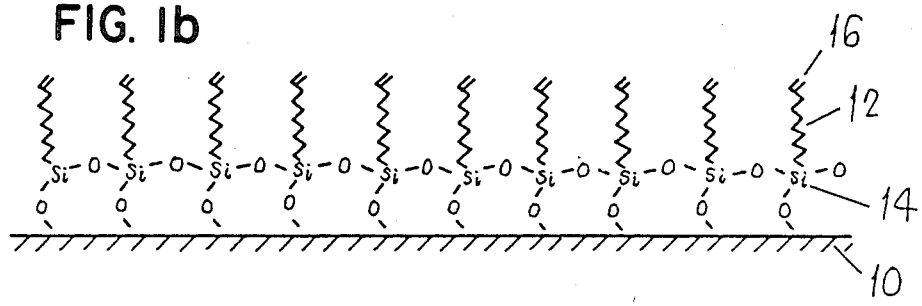
Figure 1C:
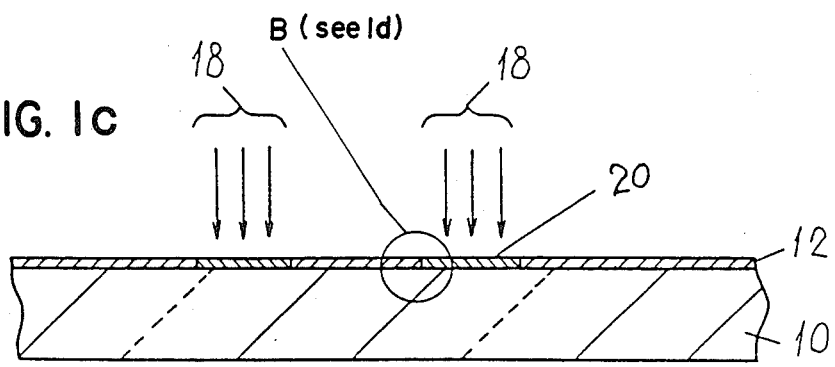
Figure 1D:
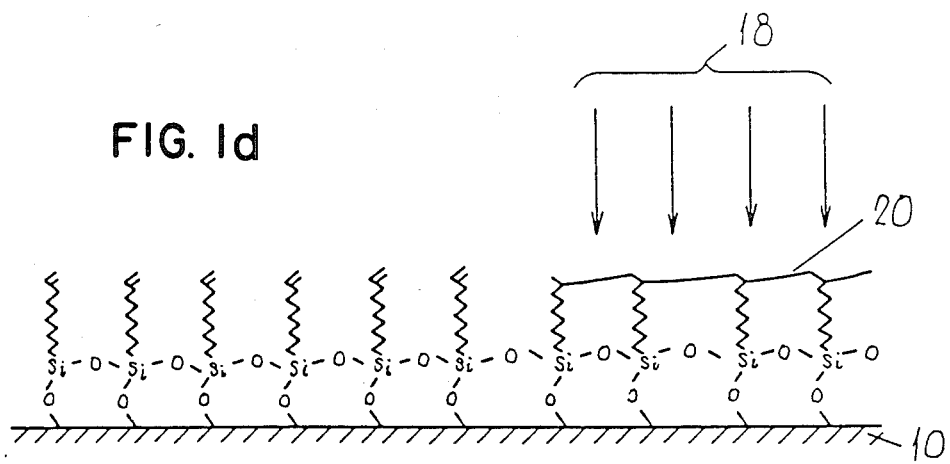

Now, the vinyl groups 16 of the silane surface active agent are juxtaposed on the substrate surface forming a film [FIG. 1(b)], and will undergo polymerization reaction among surrounding vinyl groups under irradiation by electron beams. Accordinly electron beams 18 are irradiated onto the surface in a pattern, as shown in FIG. 1(c). Then, as shown in FIG. 1(d), the double bonds of the vinyl groups at the parts 20 which are irradiated by electron beams are mutually combined to be selectively deactivated.

Figure 1E:
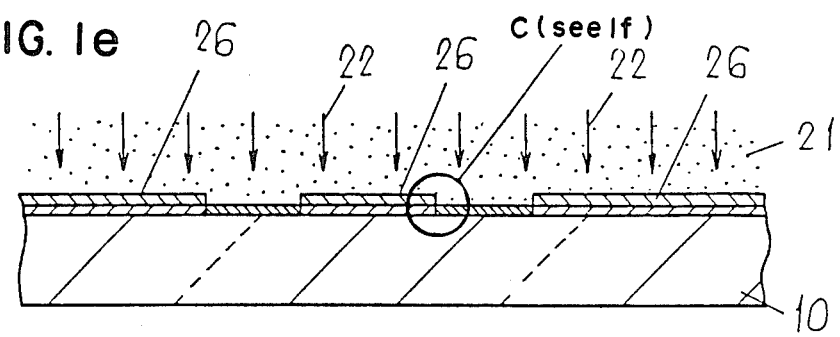
Figure 1F:
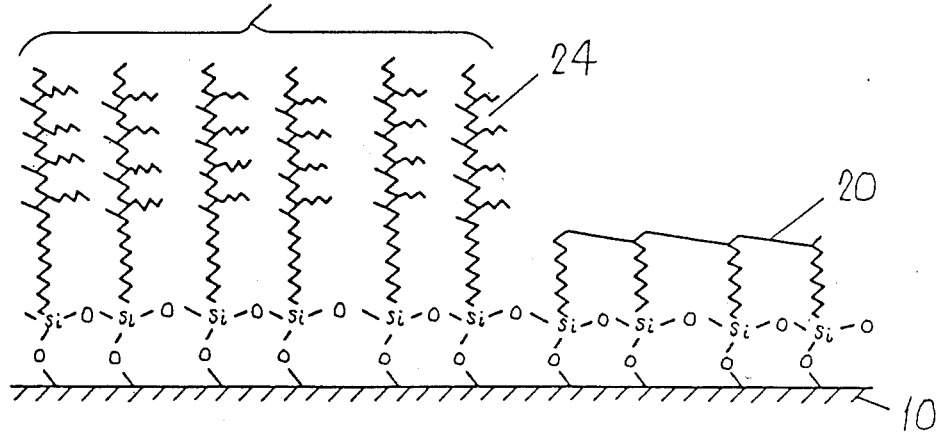

Then, as shown in FIG. 1(e), the substrate is transferred into a polymerizing monomer, for example, methyl methacrylate monomer vapor 21 at about 1 to 3 Torr (other examples of polymerizing monomer may include trimethyl vinyl silane, tributyl vinyl silane, diallyl vinyl silane, styrene, tetrafluoroethylene, acrylonitrile, methacrylic acid, divinyl benzene, vinyl toluene, and amide maleate), and the entire surface is irradiated again with far ultraviolet rays or X ray or electron beam, etc. 22 for a short time to activate the responsive group in the portion not previously deactivated, thereby additionally polymerizing 24 the monomer in a pattern. In this step, a film pattern 26 is formed [FIG. 1(f)].

This embodiment relates to a substrate producing

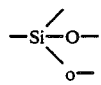

bonding by reacting with the —SiCl$_3$ group of a silane surface activating agent, that is, a Si substrate forming SiO$_2$, but. However, Al$_2$O$_3$, glass or the like may be usable as inorganic matter, and polyvinyl alcohol, gelatine, caseine, or the like as organic matter. Or when the substrate surface is coated with other water-repellent substance, hydrophilic groups may be arranged in line on the whole surface of the substrate by forming a Langmuir-Blodgett film, or the substrate may be made hydrophilic by O$_2$ plasma treatment or other process. In the Langmuir-Blodgett film, incidentally, the contact power is inferior, but if the substance on the substrate surface is water-repellent, after the accumulation is stopped when the water-repellent surface comes to the substrate side, it is possible to turn the entire surface hydrophilic.

Or when O$_2$ plasma processing is done, the substrate surface is oxidized to show hydrophilicity.

Embodiment 2

Figure 3:
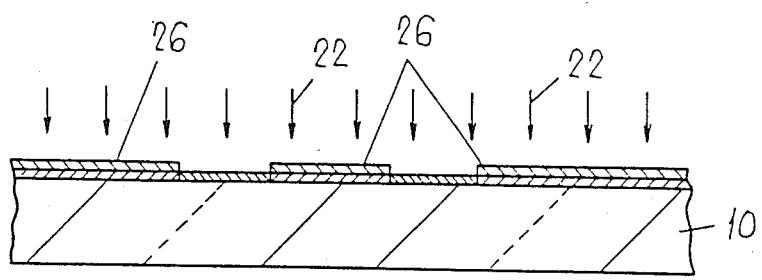
FIG. 3 is sectional view for explaining a third embodiment of the invention, which view corresponds to the step of FIG. 1(e).

Instead of steps (e) and (f) in FIG. 1, as shown in FIG. 3, the substrate is put into vacuum and the entire surface is irradiated with energy beam (such as electron beam, X ray, far ultraviolet beam) to activate the responsive group in the portion not deactivated, and immediately vapor of polymerizing monomer, for example, methyl methacrylate monomer at about 1 to 3 Torr (other examples of polymerizing monomer may include trimethyl vinyl silane, tributyl vinyl silane, diallyl methyl phenyl silane, styrene, tetrafluoroethylene, acrylonitrile, methacrylic acid, divinyl benzene, vinyl toluene, and amide maleate) is introduced to additionally polymerize 24 the monomer in a pattern. By employing this method, too, a similar film pattern 26 as in Embodiment 1 may be formed.

Figure 2A:
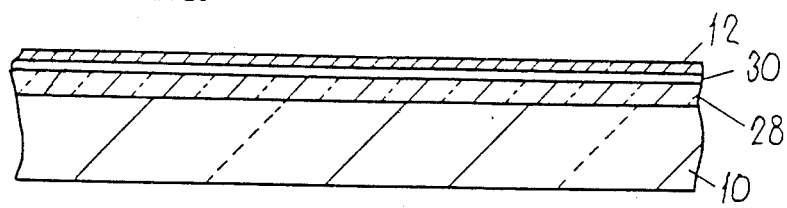
FIGS. 2(a)-(c) are sectional views showing the steps of the second embodiment of this invention, conceptual diagrams for explanation of the steps of transferring the pattern of the organic film, following the process of the first embodiment.
Figure 2B:
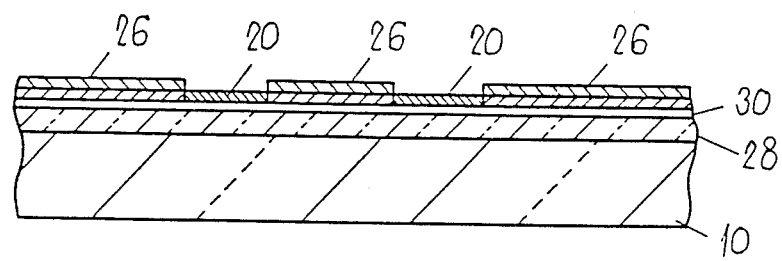
Figure 2C:
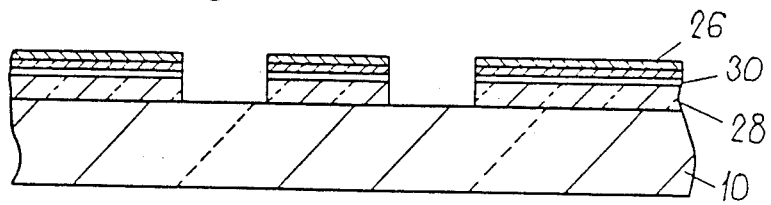

Therefore, as shown in FIG. 2, a substrate 10 is coated with organic film, for example, a photo resist 28 of rubber compound or novolak, and O$_2$ plasma (for example, 0.01 Torr, 100 W, 30 sec) processing is given to form a treated layer 30, and a silane surface activating agent is adsorbed on the resist surface by the same technique as in the first embodiment [FIG. 2(a)], and a pattern 26 is formed by the same process as in the preceding embodiment [FIG. 2(b)]. Afterwards, using the pattern 26 as mask, O$_2$ is added by 10%, and plasma processing is done in CF$_4$ gas to selectively remove the responsive film 20 including the Si in the previously deactivated portion, and successively O$_2$ plasma or O$_2$ reactive sputter etching is done to selectively remove the resist 28, so that the selective polymerized film pattern 26 may be transferred on the resist 28 [FIG. 2(c)]. In this case, photo resist is used as organic film, but it is evident that any other material may be used as far as it may be etched by O$_2$ plasma. Or, as the polymerizing monomer, when a monomer containing Si, such as trimethyl vinyl silane, is used, Si is contained in the polymerized pattern, and SiO$_2$ is formed by O$_2$ plasma, and sufficient resistance to O$_2$ plasma etching may be achieved without increasing the thickness of the polymerized film so much, so that a high resolution may be obtained. On the other hand, when a pattern is transferred on the photo resist, the thickness of the photo resist may be sufficiently increased, so that it may be used as a very fine resist pattern with a sufficient etching resistance even against dry etching generally employed in the VLSI manufacturing process (for example, reactive sputter etching using CF$_4$ to etch SiO$_2$ or Si).

In the above two embodiments, a method of adsorbing and reacting a silicon surface active agent as responsive film is shown, but it is also possible to form a responsive film by Langmuir-Blodgett's method using well-balanced amphiphatic reagents, such as reagents having —Cl— replaced by —OH[CH$_2$=CH—(CH$_2$)$_n$—Si(OH)$_3$, etc.], w-tricocene acid [CH$_2$=CH—(CH$_2$)$_2$$_0$COOH], w-heptadecene acid [CH$_2$=CH—(CH$_2$)$_1$$_4$COOH], and acetylene derivative [CH≡C—(CH$_2$)$_n$COOH].

Incidentally, although the surface reaction of —SiCl$_3$ and —OH is shown in the above embodiment, the substances are not limited to them as far as similar reaction mechanism is presented.

While specific embodiments of the invention have been illustrated and described herein, it is realized that modifications and changes will occur to those skilled in the art. It is, therefore, to be understood that the appended claims are intended to cover all modifications and changes as fall within the true spirit and scope of the invention.

What I claim is:

1. A pattern forming method comprising the steps of:
forming on a substrate a monomolecular film having responsive groups which undergo chemical vapor reactions under irradiation of an energy beam;
irradiating an energy beam in a pattern on said monomolecular film, thereby forming bonds between said responsive groups at the irradiated portion to selectively deactivate the responsive groups in the irradiated portion;
transferring said substrate into a polymerizing monomer atmosphere; and
irradiating the entire surface of said monomolecular film in said monomer atmosphere to activate the responsive groups in a pattern not deactivated and additionally polymerize said monomer onto the monomolecular film except in the previously deactivated portion, whereby a polymerized film is formed in a pattern.

2. The pattern forming method of claim 1, wherein the monomolecular film is formed so that the responsive groups may be exposed in line on the substrate surface by a Langmuir-Blodgett process or adsorption process.

3. The pattern forming method of claim 1, wherein a substance containing Si is used as the polymerizing monomer.

4. The pattern forming method of claim 3, wherein an organic photosensitive film is formed on the substrate, a polymerized film in a pattern is formed by a substance containing Si selectively, and oxygen plasma processing is conducted to transfer the pattern containing Si onto said organic film.

5. The pattern forming method of claim 1, wherein a vinyl group or ethynyl group is the responsive group or polymerizing group of the polymerizing monomer.

6. A pattern forming method comprising the steps of:
forming on a substrate a monomolecular film having responsive groups which undergo chemical vapor reactions under irradiation of an energy beam;
irradiating an energy beam in a pattern on said monomolecular film, thereby forming bonds between said responsive groups at the irradiated portion to selectively deactivate the responsive groups in the irradiated portion;
irradiating energy beams, in vacuum, onto the entire surface of the monomolecular film having the responsive groups deactivated in the pattern, to activate the responsive groups not deactivated in the preceding step; and
introducing a polymerizing monomer gas onto the responsive film to polymerize said monomer onto the monomolecular film in an area other than said pattern irradiated portion, thereby forming a polymerized film in a pattern.

7. The pattern forming method of claim 6, wherein the monomolecular film is formed so that the responsive groups may be exposed in line on the substrate surface by a Langmuir-Blodgett process or adsorption process.

8. The pattern forming method of claim 6, wherein a substance containing Si is used as the polymerizing monomer.

9. The pattern forming method of claim 8, wherein an organic photosensitive film is formed on the substrate, a polymerized film in a pattern is formed by a substance containing Si selectively, and oxygen plasma processing is conducted to transfer the pattern containing Si onto said organic film.

10. The pattern forming method claim 6, wherein a vinyl group or ethynyl group is the responsive group and polymerizing group of the polymerizing monomer.

* * * * *